United States Patent
Cao et al.

(10) Patent No.: US 10,566,991 B2
(45) Date of Patent: Feb. 18, 2020

(54) SUPPRESSING IDLE TONES IN A DELTA-SIGMA MODULATOR

(71) Applicant: TEXAS INSTRUMENTS INCORPORATED, Dallas, TX (US)

(72) Inventors: Peng Cao, Richardson, TX (US); Amit Kumar Gupta, Frisco, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/373,614

(22) Filed: Apr. 2, 2019

(65) Prior Publication Data

US 2019/0305794 A1 Oct. 3, 2019

Related U.S. Application Data

(60) Provisional application No. 62/651,439, filed on Apr. 2, 2018.

(51) Int. Cl.
*H03M 1/06* (2006.01)
*H03M 3/00* (2006.01)
*H03M 1/10* (2006.01)
*H03M 1/12* (2006.01)

(52) U.S. Cl.
CPC .......... *H03M 3/344* (2013.01); *H03M 3/458* (2013.01); *H03M 1/06* (2013.01); *H03M 1/10* (2013.01); *H03M 1/12* (2013.01); *H03M 3/30* (2013.01)

(58) Field of Classification Search
CPC ............ H03M 1/06; H03M 1/10; H03M 3/30; H03M 1/12
USPC .................. 341/118, 143, 155, 120
See application file for complete search history.

(56) References Cited

U.S. PATENT DOCUMENTS

2014/0253355 A1* 9/2014 Quiquempoix ..... H03M 1/0665
341/143

* cited by examiner

*Primary Examiner* — Joseph J Lauture
(74) *Attorney, Agent, or Firm* — John R. Pessetto; Charles A. Brill; Frank D. Cimino

(57) ABSTRACT

A delta-sigma modulator architecture with idle tone suppression based on injecting an out-of-band signal includes: modulator input circuitry to provide a modulator input signal; modulator loop circuitry to quantize the modulator input signal to generate a modulator output signal at an oversampling frequency, and to provide a feedback signal. Digital filtering circuitry filters the modulator output signal to provide a digital output signal at a data rate frequency related to the oversampling frequency by a defined oversampling ratio. Out-of-band (OoB) signal generator circuitry injects a deterministic OoB injection signal at a defined OoB frequency outside of a target frequency band. The modulator input circuitry combines the analog input signal, the feedback signal, and the OoB injection signal into the modulator input signal. The digital filtering circuitry filters the OoB injection signal. The OoB injection signal can be selectively defined to suppress idle tones generated in the modulator loop circuitry.

8 Claims, 6 Drawing Sheets

SUPPRESSING IDLE TONES IN A DELTA-SIGMA MODULATOR

CROSS-REFERENCE TO RELATED APPLICATIONS

Priority is claimed under 37 CFR 1.78 and 35 USC 119(e) to U.S. Provisional Application 62/651,439, filed 2018 Apr. 2, which is incorporated by reference in its entirety.

BACKGROUND

Delta-sigma modulators can produce idle tones in the target frequency band (band of interest) for certain nominal DC input voltages (including input short). For example, idle tones can be caused by either modulator architecture or circuit implementation (for example, parasitic capacitance). In-band idle tones can limit SNR and dynamic range performance.

Prior techniques for suppressing/breaking idle tones include dithering to introduce randomization to break the idle tone(s), and introducing DC offset to shift the idle tone(s) to an out-of-band frequency (out of the passband).

BRIEF SUMMARY

This Brief Summary is provided as a general introduction to the Disclosure provided by the Detailed Description and Drawings, summarizing aspects and features of the Disclosure. It is not a complete overview of the Disclosure, and should not be interpreted as identifying key elements or features of, or otherwise characterizing or delimiting the scope of, the disclosed invention.

The Disclosure describes apparatus and methods for a delta-sigma modulator architecture with idle tone suppression based on injecting an out-of-band signal at the modulator input stage, such as for use in a delta-sigma ADC.

According to aspects of the Disclosure, the delta-sigma modulator circuitry includes: modulator input circuitry to provide a modulator input signal; modulator loop circuitry to quantize the modulator input signal to generate a modulator output signal at an oversampling frequency, and to provide a feedback signal. Digital filtering circuitry is configured to filter the modulator output signal to provide a digital output signal at a data rate frequency (fDR) related to the oversampling frequency by a defined oversampling ratio. Out-of-band (OoB) signal generator circuitry is configured to inject a deterministic OoB injection signal at a defined OoB frequency outside of a target frequency band. The modulator input circuitry is configured to combine the analog input signal, the feedback signal, and the OoB injection signal into the modulator input signal. The digital filtering circuitry is configured to filter the OoB injection signal. The OoB injection signal can be selectively defined to suppress idle tones generated in the modulator loop circuitry.

Other aspects and features of the invention claimed in this Patent Document will be apparent to those skilled in the art from the following Disclosure.

BRIEF DESCRIPTION OF THE DRAWINGS

FIG. 4A illustrates an example OoB injection signal 401A that is substantially at $f_{DR}/2$ (OoB), which can be filtered with a wideband filter represented by an ideal brick-wall filter 431A; and FIGS. 4B-4C illustrates an example OoB injection signal 401B/401C that is substantially at $f_{DR}$, which can be filtered 431B/431C by a sinc filter.

DETAILED DESCRIPTION

This Description and the Drawings constitute a Disclosure, including design examples and implementations, and including illustrating various technical features and advantages for: a delta-sigma modulator architecture with idle tone suppression based on injecting an out-of-band signal at the modulator input.

Figure 4A:
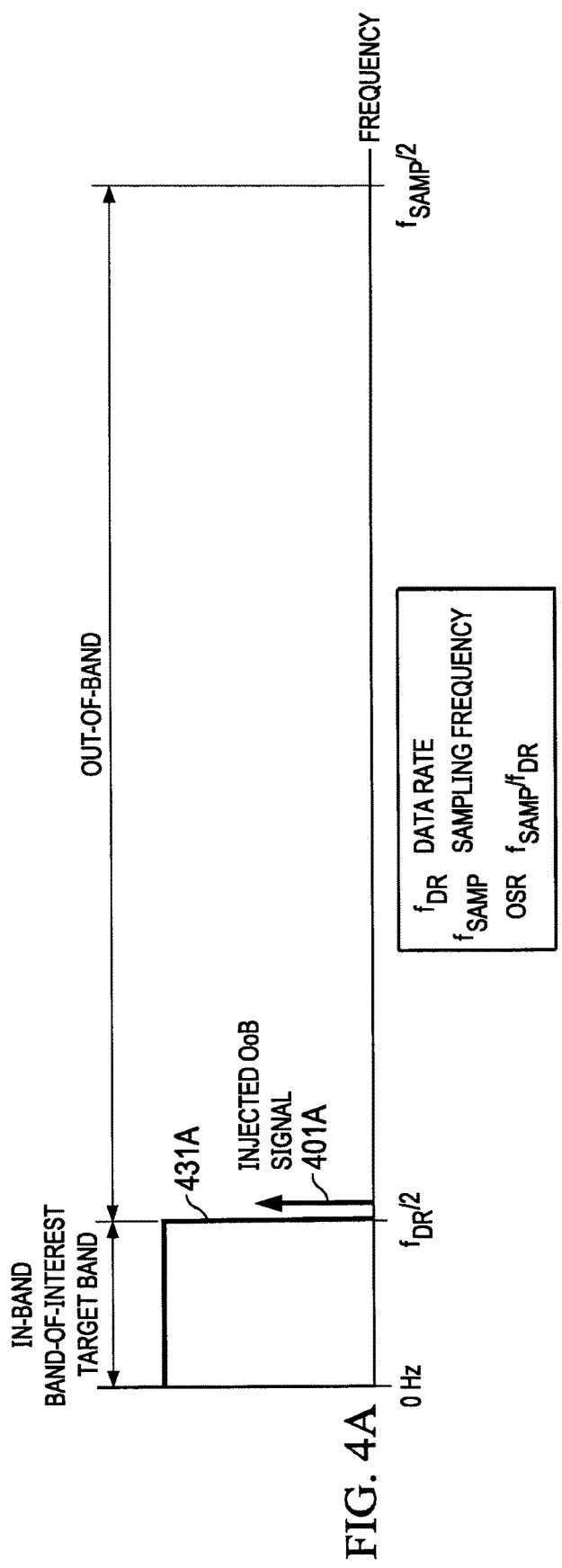
FIGS. 4A-4C provide example frequency spectrum illustrating an injected OoB signal 401A-401C that is out-of-band (out of the target frequency band), and the associated digital filtering to remove the injected OoB signal.
Figure 4B:
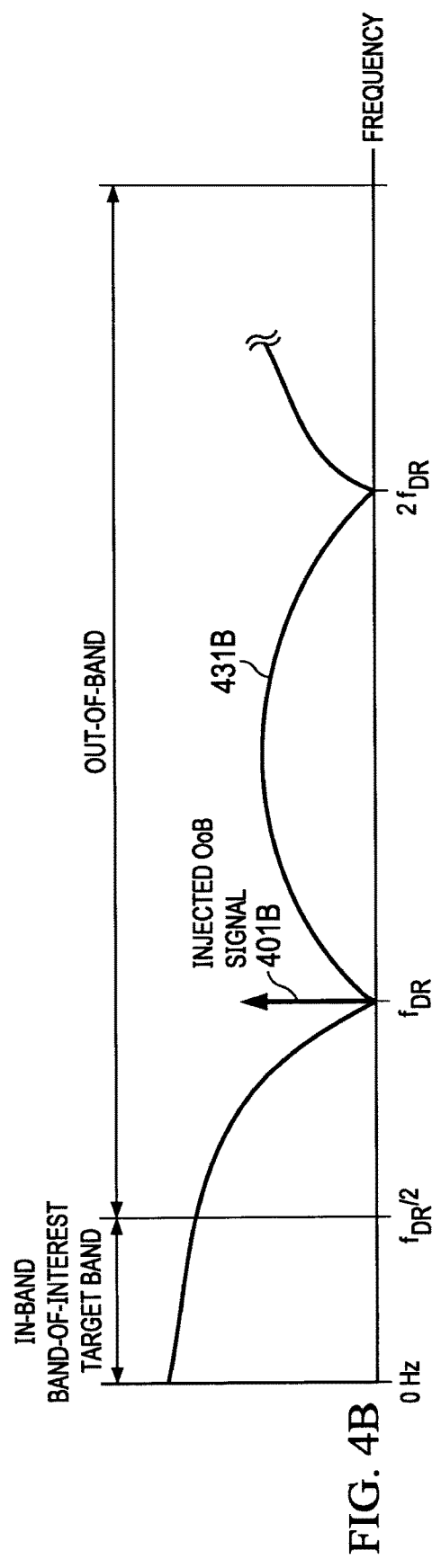
Figure 4C:
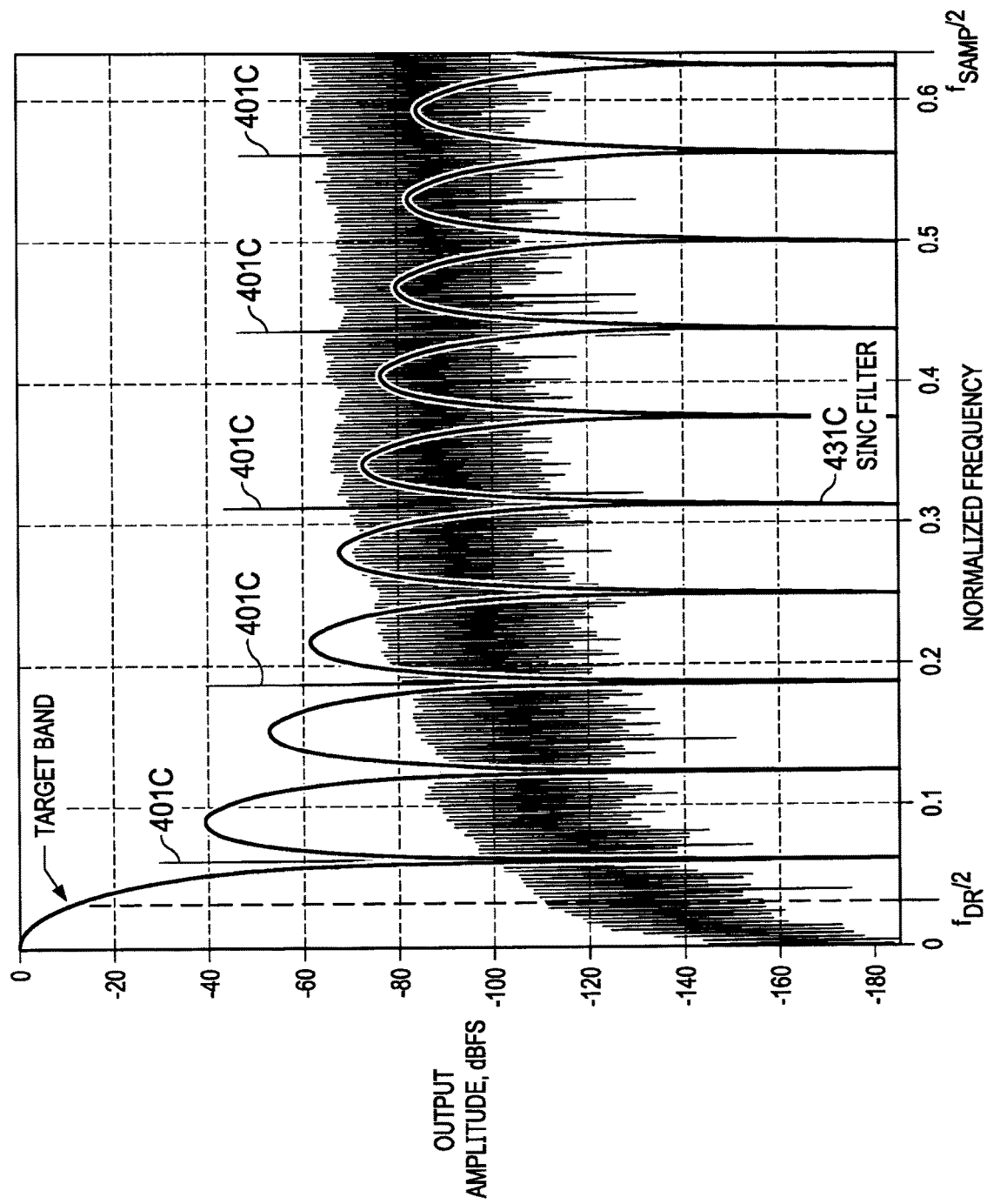

The injected out-of-band (OoB) signal is at a defined frequency that is selectively outside a target frequency band, also referred to as the band-of-interest or in-band (see, for example, FIGS. 4A-4C). The OoB injection signal is at a frequency selected to suppress idle tone(s) generated in the delta-sigma modulator for nominal DC input voltages, and which can be filtered by a digital filter that filters/decimates the modulator output.

The delta-sigma modulator architecture with out-of-band signal injection to suppress idle tones in the modulator is described in the context of an example application of a discrete-time delta-sigma ADC, although the Disclosed delta-sigma architecture including idle tone suppression is applicable to other delta-sigma modulator architectures, such as a delta-sigma DAC, and to continuous time architectures.

In brief overview, a delta-sigma modulator architecture with idle tone suppression based on injecting an out-of-band signal includes: modulator input circuitry to provide a modulator input signal; modulator loop circuitry to quantize the modulator input signal to generate a modulator output signal at an oversampling frequency, and to provide a feedback signal. Digital filtering circuitry filters the modulator output signal to provide a digital output signal at a data rate frequency related to the oversampling frequency by a defined oversampling ratio. Out-of-band (OoB) signal generator circuitry injects a deterministic OoB injection signal at a defined OoB frequency outside of a target frequency band. The modulator input circuitry combines the analog input signal, the feedback signal, and the OoB injection signal into the modulator input signal. The digital filtering circuitry filters the OoB injection signal. The OoB injection signal can be selectively defined to suppress idle tones generated in the modulator loop circuitry.

Figure 1A:
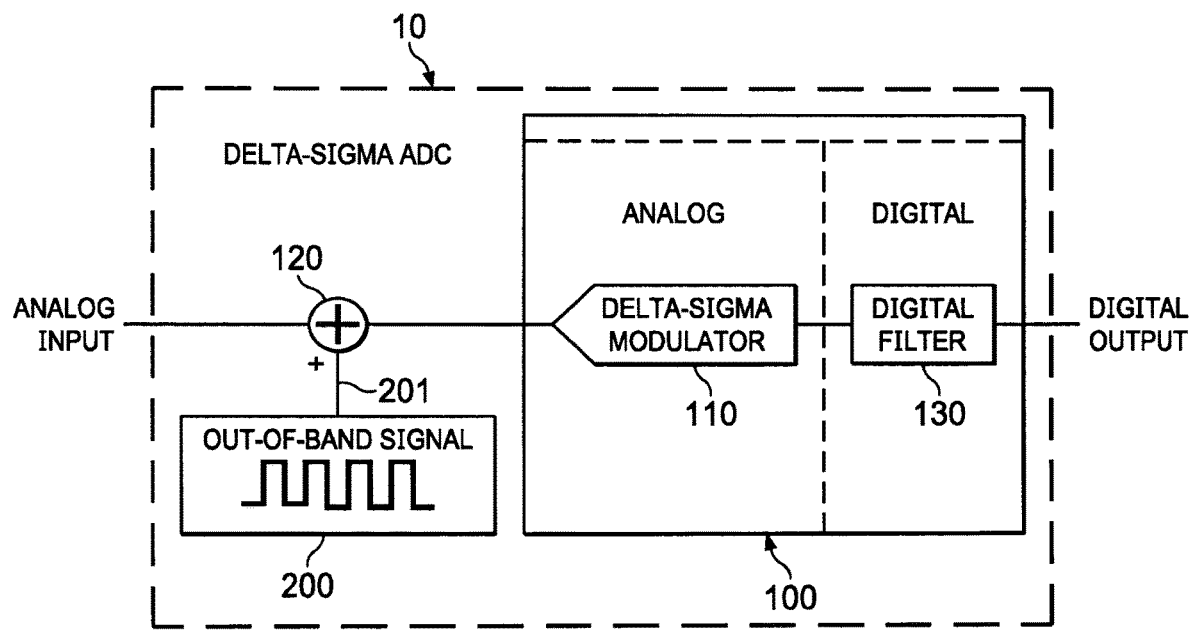
FIGS. 1A and 1B illustrates an example architecture for a delta-sigma ADC 10 (discrete-time or continuous-time) including an OoB (out-of-band) signal generator for suppressing idle tones generated by a delta-sigma modulator 100, including an OoB signal generator 200 to inject, at a modulator input stage 120, a deterministic OoB signal 201 at a defined OoB frequency that is selectively outside a target frequency band.
Figure 1B:
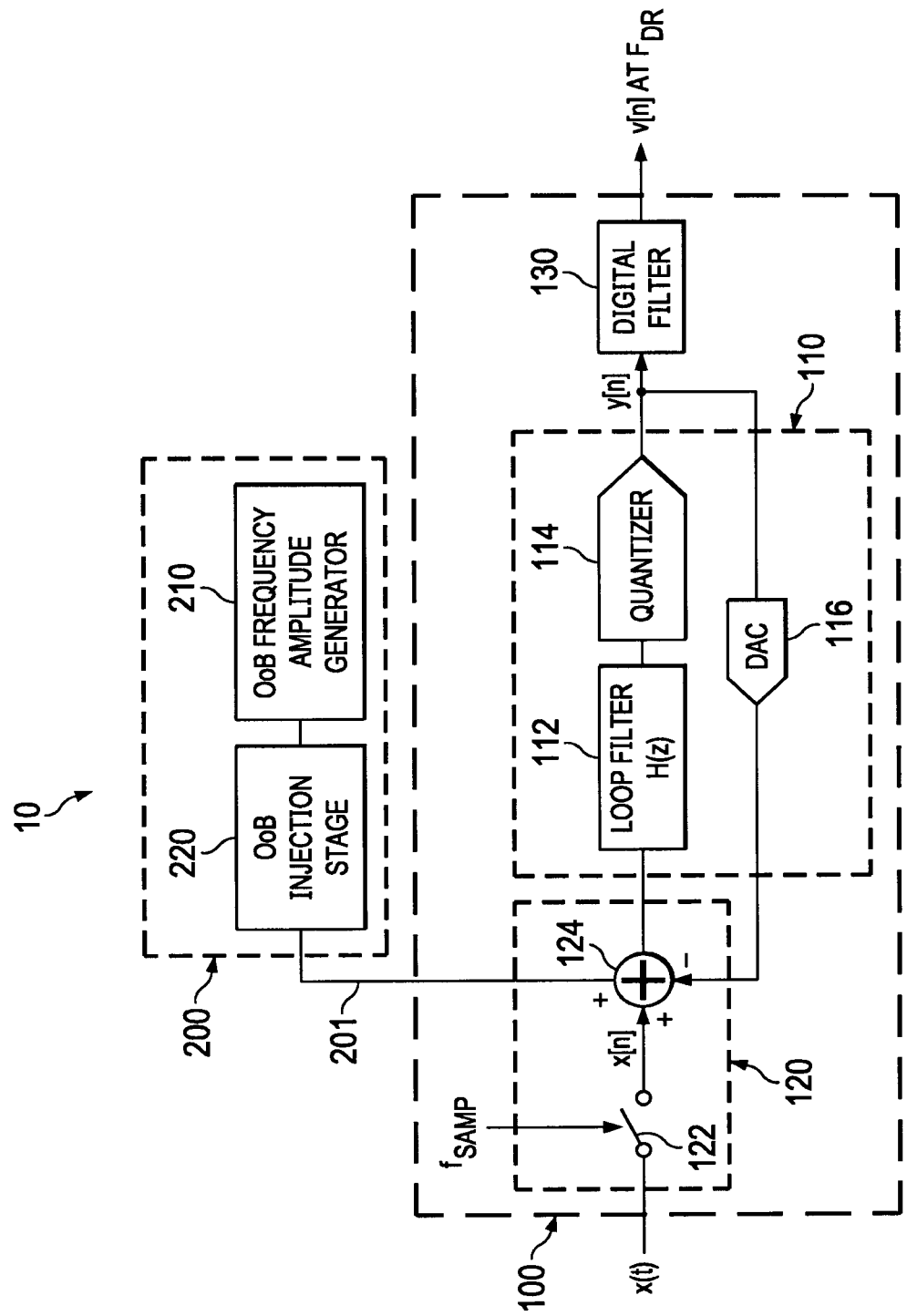

FIGS. 1A and 1B illustrates an example architecture for a delta-sigma modulator with idle tone suppression based on injecting a deterministic out-of-band signal. The OoB signal is selected to be at a defined frequency that is out of the target band (band-of-interest), to suppress idle tone(s) generated in the delta-sigma modulator for nominal DC input voltages, and which can be removed by a digital filter that filters the modulator output, according to the Disclosure.

The example delta-sigma modulator architecture 10 is implemented as a delta-sigma ADC 100, or an integrated circuit that includes the delta-sigma ADC. The delta-sigma ADC 100 includes a delta-sigma modulator 110, with an input stage represented by combiner 120, and a digital filter 130.

According to aspects of the Disclosure, an OoB signal generator 200 generates the OoB signal injected at the delta-sigma modulator input stage 120 to suppress idle tone(s) generated in the delta-sigma modulator, the OoB injection signal generated at a defined OoB frequency that is outside the target frequency band, and can be removed by the digital filter 130.

Referring to FIG. 1B, the example delta-sigma modulator 110 is a discrete time implementation in which the input signal is oversampled at the modulator frequency $f_{SAMP}$, before input to the delta-sigma modulator loop. The delta-sigma modulator loop includes a loop filter 112, quantizer 114 and feedback DAC 116, and generates a modulator output at the oversampling frequency $f_{SAMP}$, including higher frequency quantization noise. The modulator output is filtered by the digital filter 130 to suppress quantization noise, with decimation by a defined oversampling ratio (OSR) $f_{SAMP}/f_{DR}$.

The example input stage 120 is a switched (sampling) capacitor configuration represented by switch 122 driven by the modulator (sampling) clock(s) represented by $f_{SAMP}$, that samples the input signal x(t). The sampled input signal is combined 124 with the feedback DAC 116 output, and according to aspects of the Disclosure, with the OoB injection signal 201 generated by the OoB signal generator 200.

The OoB signal generator 200 includes an OoB frequency/amplitude generator 210, and an OoB injection stage 220. The OoB signal generator 200 outputs the deterministic OoB injection signal to the modulator input stage 124. The OoB signal generator is preferably integrated with the delta-sigma modulator, by can be implemented as an external signal generator providing OoB signal input to the modulator.

Figure 2:
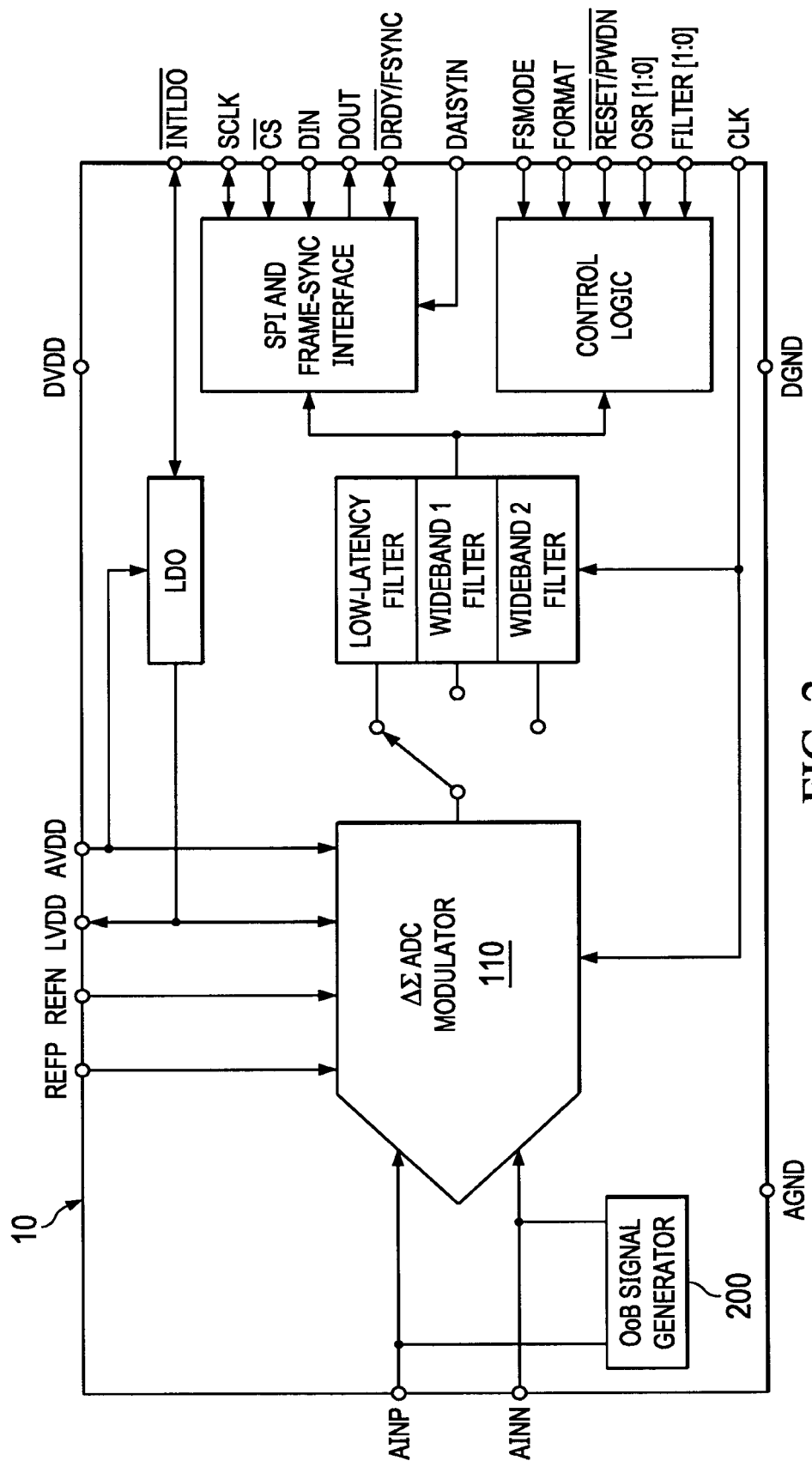
FIG. 2 illustrates an example delta-sigma ADC 10, including a modulator 100 and OoB signal generator 200.

FIG. 2 illustrates an example delta-sigma ADC 10, including a modulator 110 and OoB signal generator 200.

Figure 3B:
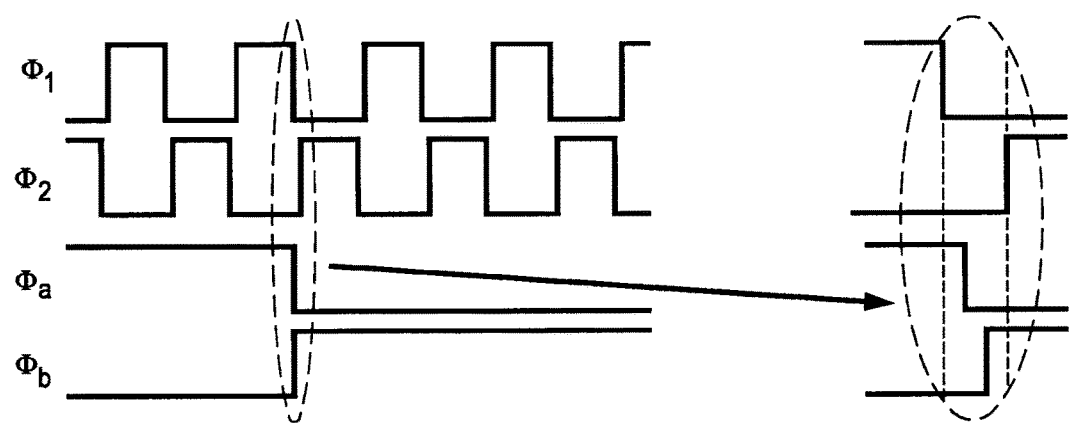
FIGS. 3A and 3B illustrate an example design for a OoB signal generator 300 according to the Disclosure, implemented for use with a discrete time delta-sigma modulator 110 (with non-overlapping modulator clocks $\phi1\phi2$), the OoB signal generator 300 including an OoB clock generator 311 to generate non-overlapping OoB clocks $\phi a\phi b$, and an OoB injection stage 320, to generate the OoB injection signal at the defined OoB frequency outside the target frequency band, with FIG. 3B illustrating example non-overlapping OoB clocks $\phi a\phi b$ clocks that toggle within the non-overlapping period of the modulator clocks $\phi1\phi2$, ensuring that $\phi a$ and $\phi b$ do not toggle during the integrating phase $\phi2$ of the modulator clocks.
Figure 3A:
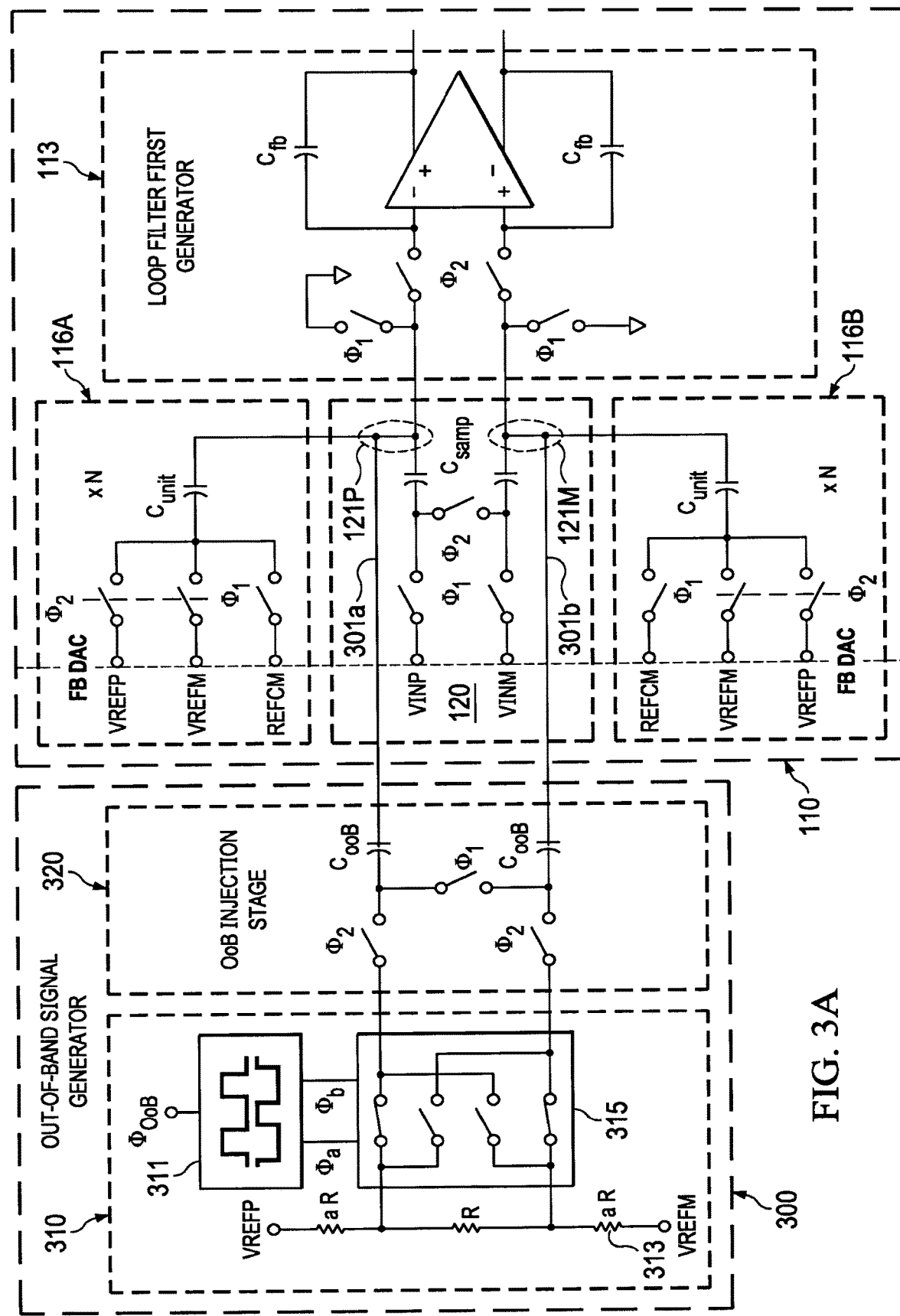

FIGS. 3A and 3B illustrate an example OoB signal generator 300 to generate an OoB injection signal 301a/301b at an OoB frequency selectively defined to suppress idle tone(s) in the modulator, and to be removed by the digital filter.

Referring to FIG. 3A, the OoB signal generator 300 generates differential deterministic OoB signals 301a/301b, injected at the modulator input stage 120, at a defined OoB frequency to suppress idle tone(s) in the modulator 110. The OoB signals 301a/301b are introduced to suppress idle tones without requiring dithering randomization to suppress the idle tone, or introducing DC offset to shift the idle tone to a higher frequency.

The OoB signal generator 300 is implemented for use with a discrete time delta-sigma modulator 110, with a switched capacitor input stage 120 driven by non-overlapping modulator clocks $\phi 1 \phi 2$. The example switched capacitor input stage 120 samples the differential input signals VINP and VINM with switched sampling capacitors Csamp, switched by non-overlapping modulator clocks $\phi 1$ and $\phi 2$. The sampled input signals are combined at summing nodes 121P/121M with feedback DAC outputs 116A/116B, and the OoB injection signals 301a/301b generated by the OoB signal generator 300 at the selectively defined OoB frequency.

The example feedback DACs 116A/116B are configured for a multi-order delta-sigma modulator with a multi-bit quantizer (xN). For a multibit quantizer with N levels, the feedback DAC consist of N Cunit-switch elements.

The modulator input stage 120 provides input to the delta-sigma modulator loop represented by a first integrator 113 of the loop filter (FIG. 1B, 112) and the rest of integrators which are not shown for simplicity in this disclosure.

The OoB signal generator 300 includes an OoB frequency generator 311, an OoB amplitude generator 313, and an OoB injection stage 320. The OoB frequency/amplitude generator 310 includes an OoB frequency generator 311 to generate non-overlapping OoB clocks $\phi a \phi b$ based on a $\phi OoB$ clock which is set by dividing down the modulator clocks $\phi 1 \phi 2$, with amplitude controlled by a resistor divider (amplitude generator) 313. The OoB clocks $\phi a \phi b$ are non-overlapping to avoid any short on the resistor divider 313.

The OoB clocks $\phi a \phi b$, are input through a switch network 315 to the OoB injection stage 320. The OoB injection stage 320 is implemented with switched capacitors COoB that are parallel-coupled (top plate) to the modulator input stage sampling capacitors Csamp.

The OoB frequency of the injected OoB signals 301a/301b is set by dividing down the modulator clocks $\phi 1 \phi 2$. The amplitude $A_{OoB}$ of the injected OoB signals is set by the resistor and capacitor ratios:

$$A_{OoB} = \frac{C_{OoB}}{N \times C_{unit}} \frac{R}{(2a+1)R}(VREFP - VREFM)$$

The accuracy of the ratios is relaxed, since the OoB injection signal is filtered out in the digital domain. Capacitor $C_{OoB}$ can be small enough to avoid noise and power increase.

FIG. 3B illustrates a preferred implementation in which the non-overlapping OoB clocks $\phi a \phi b$ clocks toggle within the non-overlapping period of the modulator clocks $\phi 1 \phi 2$, ensuring that $\phi a$ and $\phi b$ do not toggle during the integrating phase $\phi 2$ of the modulator clocks. This timing arrangement avoids disturbance of the normal modulator operation by injection of the OoB signal, ensuring that the OoB clocks $\phi a \phi b$ do not toggle during the integrating/sampling phase of the modulator clocks $\phi 2 \phi 1$.

FIGS. 4A-4C provide example frequency spectrum illustrating an injected OoB signal 401A-401C that is out-of-band (out of the target band or band-of-interest), and selected to suppress idle tones, and the associated digital filtering to remove the injected OoB signal, according to aspects of the Disclosure.

FIG. 4A illustrates an example OoB injection signal 401A that is selected to be out-of-band substantially at the edge of the target band at $f_{DR}/2$ or higher frequency. OoB signal 401A can be filtered with a wideband filter represented by an ideal brick-wall filter 431A.

FIGS. 4B-4C illustrates an example injected OoB signal 401B/401C that is selected for filtering by a SINC filter. The example OoB injection signal is selected to by out-of-band substantially at $f_{DR}$, or integer times of $f_{DR}$, corresponding to the notch frequencies of a sinc filter 431B/431C.

In summary, a delta-sigma modulator architecture, such as for a delta-sigma ADC, can include: modulator input circuitry to sample an input signal at an oversampling frequency, and to provide a modulator input signal based in part on the sampled input signal; and modulator loop circuitry to quantize the modulator input signal to generate a modulator output signal, the modulator loop circuitry to provide a feedback signal to the modulator input circuitry; and digital filtering circuitry to filter the modulator output signal to provide a digital output signal at a data rate frequency (fDR) related to the oversampling frequency by a defined oversampling ratio. Out-of-band (OoB) signal generator circuitry coupled to the modulator input circuitry is configured to inject a deterministic OoB injection signal at a defined OoB frequency outside of a target frequency band. The modulator input circuitry is configured to combine the sampled input signal, the feedback signal, and the OoB injection signal to provide the modulator input signal. The digital filtering circuitry is configured to filter the OoB injection signal. The OoB injection signal can be selectively defined to suppress idle tones generated in the modulator loop circuitry. The delta-sigma modulator can be a discrete-time delta-sigma modulator, and: the input stage circuitry includes switched capacitor sampling circuitry controlled by non-overlapping modulator clock signals φ1 and φ2; and the OoB signal generator circuitry can include OoB clock generator circuitry to generate non-overlapping OoB clock signals φa and φb based on the modulator clock signals φ1 and φ2, and OoB injection stage (digital-to-analog converter) circuitry to convert the OoB clock signals to the OoB injection signal. The OoB signal generator circuitry can further includes a resistor divider to control an amplitude of the OoB clock signals φa and φb. The non-overlapping OoB clock signals φa and φb can be generated so that they toggle during a non-overlapping period of the modulator clock signals φ1 and φ2. The OoB frequency of the OoB injection signal can be in a range between: $f_{DR}/2$ and $f_{SAMP}/2$. The OoB frequency of the OoB signal can be higher than $f_{DR}/2$ or substantially integer times of $f_{DR}$, and the digital filtering circuitry is one of a wideband filter configured to filter the OoB signal at the frequency higher than fDR/2, and a sinc filter configured to filter the OoB signal at the frequency of substantially fDR.

The Disclosure provided by this Description and the Figures sets forth example designs and applications illustrating aspects and features of the invention, and does not limit the scope of the invention, which is defined by the claims. Known circuits, connections, functions and operations are not described in detail to avoid obscuring the principles and features of the Disclosed example designs and applications. This Disclosure can be used by ordinarily skilled artisans as a basis for modifications, substitutions and alternatives, including adaptations for other applications.

The invention claimed is:

1. A circuit including delta-sigma modulation, comprising:
   delta-sigma modulator circuitry, including
      an input interface to receive an analog input signal,
      modulator input circuitry coupled to the input interface to sample the input signal at an oversampling frequency, and to provide a modulator input signal based in part on the sampled input signal, and
      modulator loop circuitry to quantize the modulator input signal to generate a modulator output signal, the modulator loop circuitry to provide a feedback signal to the modulator input circuitry; and
   digital filtering circuitry to filter the modulator output signal to provide a digital output signal at a data rate frequency (fDR) related to the oversampling frequency by a defined oversampling ratio; and
   out-of-band (OoB) signal generator circuitry coupled to the modulator input circuitry to inject a deterministic OoB injection signal at a defined OoB frequency outside of a target frequency band;
   the modulator input circuitry to combine the sampled input signal, the feedback signal, and the OoB injection signal to provide the modulator input signal; and
   the digital filtering circuitry to filter the OoB injection signal.

2. The circuit of claim 1, wherein:
   the OoB injection signal selectively defined to suppress idle tones generated in the modulator loop circuitry.

3. The circuit of claim 1 wherein the delta-sigma modulator is a discrete-time delta-sigma modulator, and wherein:
   the input stage circuitry includes switched capacitor sampling circuitry controlled by non-overlapping modulator clock signals φ1 and φ2; and
   the OoB signal generator circuitry includes:
      OoB clock generator circuitry to generate non-overlapping OoB clock signals φa and φb based on the modulator clock signals φ1 and φ2, and
      OoB injection stage (digital-to-analog converter) circuitry to convert the OoB clock signals to the OoB injection signal.

4. The circuit of claim 3, wherein the OoB signal generator circuitry further includes a resistor divider to control an amplitude of the OoB clock signals φa and φb.

5. The circuit of claim 3, wherein the non-overlapping OoB clock signals φa and φb are generated so that they toggle during a non-overlapping period of the modulator clock signals φ1 and φ2.

6. The circuit of claim 1, wherein the OoB frequency of the OoB injection signal is in a range between: $f_{DR}/2$ and $f_{SAMP}/2$.

7. The circuit of claim 6, wherein:
   the OoB frequency of the OoB signal is higher than $f_{DR}/2$ or substantially integer times of $f_{DR}$; and
   the digital filtering circuitry is one of a wideband filter configured to filter the OoB signal at the frequency higher than fDR/2, and a sinc filter configured to filter the OoB signal at the frequency of substantially fDR.

8. The circuit of claim 1, wherein the delta-sigma modulator is use in a delta-sigma ADC.

* * * * *